(12) United States Patent
Minami et al.

(10) Patent No.: US 7,370,314 B2
(45) Date of Patent: May 6, 2008

(54) METHOD AND PROGRAM FOR GENERATING LAYOUT DATA OF A SEMICONDUCTOR INTEGRATED CIRCUIT AND METHOD FOR MANUFACTURING A SEMICONDUCTOR INTEGRATED CIRCUIT WITH OPTICAL PROXIMITY CORRECTION

(75) Inventors: Fumihiro Minami, Yokohama (JP); Toshiya Kotani, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 294 days.

(21) Appl. No.: 11/347,771

(22) Filed: Feb. 3, 2006

(65) Prior Publication Data
US 2006/0184908 A1    Aug. 17, 2006

(30) Foreign Application Priority Data
Feb. 8, 2005    (JP) .......................... P2005-032243

(51) Int. Cl.
*G06F 17/50*    (2006.01)

(52) U.S. Cl. .............................. 716/21; 716/6; 716/11; 716/12; 716/19

(58) Field of Classification Search ................... 716/6, 716/11, 12, 19, 21
See application file for complete search history.

(56) References Cited

U.S. PATENT DOCUMENTS

| | | | |
|---|---|---|---|
| 6,459,487 B1 * | 10/2002 | Chen et al. ................. | 356/491 |
| 2005/0250022 A1 | 11/2005 | Kotani | |
| 2005/0273754 A1 | 12/2005 | Nojima | |

* cited by examiner

*Primary Examiner*—Thuan Do
(74) *Attorney, Agent, or Firm*—DLA Piper US LLP

(57) ABSTRACT

A method for generating layout data of a semiconductor integrated circuit includes applying optical proximity correction conditions to cells so as to generate cell patterns, selecting cell patterns to correspond cells, based on layout information of cells along a specified signal propagating path; calculating delay times for the signal propagating path for combinations of cell patterns; selecting a combination of cell patterns, based on lengths of the calculated delay times and the allowable delay time; and generating layout data of the signal propagating path using the selected combination.

20 Claims, 7 Drawing Sheets

METHOD AND PROGRAM FOR GENERATING LAYOUT DATA OF A SEMICONDUCTOR INTEGRATED CIRCUIT AND METHOD FOR MANUFACTURING A SEMICONDUCTOR INTEGRATED CIRCUIT WITH OPTICAL PROXIMITY CORRECTION

CROSS REFERENCE TO RELATED APPLICATIONS AND INCORPORATION BY REFERENCE

This application is based upon and claims the benefit of priority from prior Japanese Patent Application P2005-032243 filed on Feb. 8, 2005; the entire contents of which are incorporated by reference herein.

BACKGROUND OF THE INVENTION

1. Field of the Invention

The present invention relates to a layout method of a semiconductor integrated circuit, particularly for an automatic layouting method and a program for generating layout data of a semiconductor integrated circuit, and a method for manufacturing a semiconductor integrated circuit with optical proximity correction.

2. Description of the Related Art

Along with the miniaturization of elements such as transistors or interconnects used in semiconductor integrated circuits, the size of element has become smaller than light source wavelengths used for an aligner. In such cases, during a photolithography process or an etching process, the planar shape of an element pattern in the periphery of an element to be formed adversely affects the planar shape of the element pattern to be formed. As a result, it is difficult to form the element pattern on a wafer according to a design pattern. Therefore, optical proximity correction (OPC) has been performed so as to add a correction pattern to the design pattern in advance so that the planar shape of the formed element pattern can assume a desired shape.

When carrying out OPC to generate a cell mask pattern, lithography simulation and the like is performed based on the generated mask pattern so as to calculate the planar shape of an element pattern to be formed on the wafer. Conditions for OPC are then set so that differences in dimension between the planar shapes of the generated mask patterns and the planar shapes of the calculated element patterns can fall within a desired range of differences in dimension (hereafter referred to as 'dimensional tolerance'). OPC is then carried out for cells under the set conditions for OPC, thereby generating a cell pattern. Required conditions for the dimensional tolerance are hereafter referred to as 'dimensional tolerance conditions'.

In the case of recent highly integrated elements and interconnects, the stricter the dimensional tolerance conditions, namely, the smaller the dimensional tolerances are set, the more the planar shape of the element pattern formed on the wafer resembles the planar shape of the design element pattern. However, the mask pattern generally has more places that need to be corrected through OPC as the dimensional tolerance conditions become stricter. Accordingly, the time required for OPC increases. The greater the dimensional tolerances are set by relaxing dimensional tolerance conditions, the more the time required for OPC decreases. However, in the case of carrying out OPC by relaxing dimensional tolerance conditions, the difference between the planar shape of an element pattern formed on the wafer and the planar shape of the design pattern increases. Therefore, the difference between characteristics of the actually manufactured element and characteristics of the desired element increases. As a result, characteristics of semiconductor integrated circuits are impaired and desired characteristics are unsatisfied, thereby reducing the yield ratio.

SUMMARY OF THE INVENTION

An aspect of the present invention inheres in a computer implemented method for generating layout data of a semiconductor integrated circuit. The method includes applying a plurality of optical proximity correction conditions to a plurality of cells, respectively, so as to generate a plurality of cell patterns differing in signal delay time; selecting the cell patterns to correspond to each of the cells, based on layout information of cells along a specified signal propagating path in the semiconductor integrated circuit; calculating a plurality of delay times for the signal propagating path for combinations of the cell patterns, respectively; selecting a combination of cell patterns to be used along the signal propagating path from among the combinations, based on comparison of lengths of the calculated delay times and an allowable delay time for the signal propagating path; and generating layout data of the signal propagating path in the semiconductor integrated circuit using the selected combination of cell patterns.

Another aspect of the present invention inheres in a method for manufacturing a semiconductor integrated circuit. The method includes applying a plurality of optical proximity correction conditions to a plurality of cells, respectively, so as to generate a plurality of cell patterns differing in signal delay time; selecting the cell patterns corresponding to each of the cells, based on layout information of cells along a specified signal propagating path in the semiconductor integrated circuit; calculating a plurality of delay times for the signal propagating path for combinations of the cell patterns, respectively; selecting a combination of cell patterns to be used along the signal propagating path from among the combinations, based on comparison of lengths of the calculated delay times and an allowable delay time for the signal propagating path; and generating layout data of the signal propagating path in the semiconductor integrated circuit using the selected combination of cell patterns; applying the optical proximity correction conditions to each of the cell patterns so as to generate mask data of a plurality of mask levels, based on the layout data; manufacturing a plurality of masks utilizing the mask data of the plurality of mask levels; and executing processing of the semiconductor substrate using the masks by forming processing masks in order, each of the processing masks corresponding to one of the masks, respectively, on the surface of a semiconductor substrate.

Still another aspect of the present invention inheres in a computer program product to be executed by a computer for generating layout data of a semiconductor integrated circuit. The computer program product includes instructions configured to apply a plurality of optical proximity correction conditions to a plurality of cells, respectively, so as to generate a plurality of cell patterns differing in signal delay time; instructions configured to select the cell patterns correspond to each of the cells, based on layout information of cells along a specified signal propagating path in the semiconductor integrated circuit; instructions configured to calculate a plurality of delay times for the signal propagating path for combinations of the cell patterns, respectively; instructions configured to select a combination of cell patterns to be used along the signal propagating path from among the combinations, based on comparison of lengths of the calculated delay times and an allowable delay time for the signal propagating path; and instructions configured to generate layout data of the signal propagating path in the semiconductor integrated circuit using the selected combination of cell patterns.

DETAILED DESCRIPTION OF THE INVENTION

Figure 1:
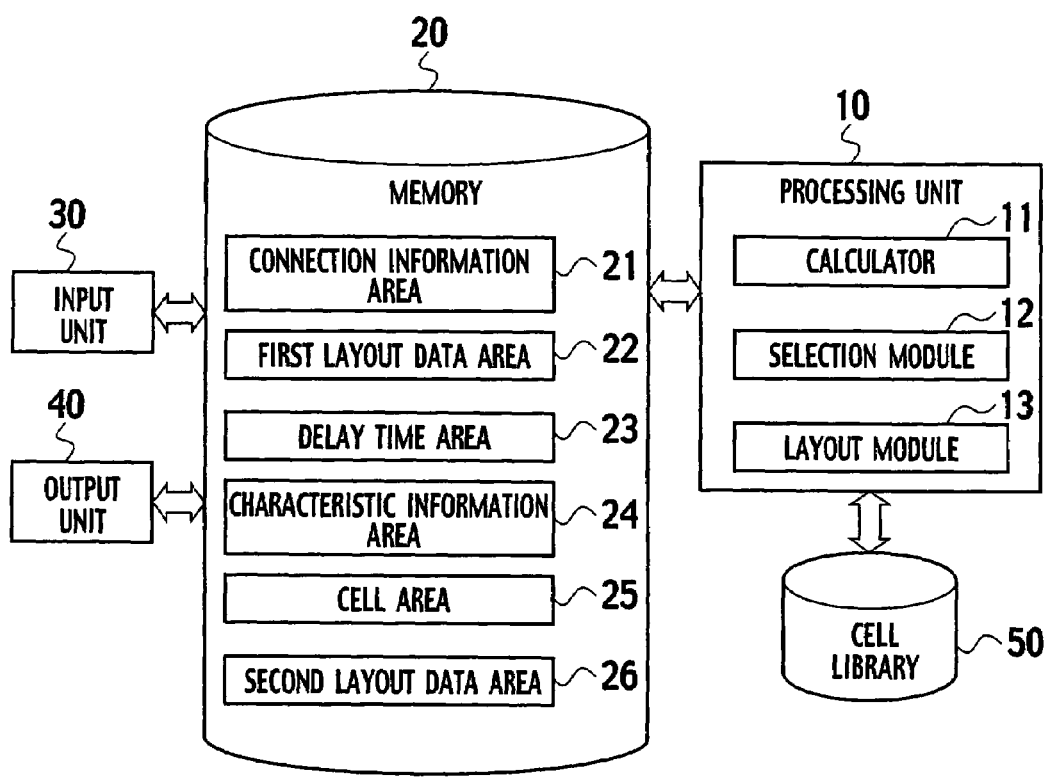
FIG. 1 shows a schematic organization of a layout apparatus for generating layout data according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

A method for generating layout data of a semiconductor integrated circuit according to an embodiment of the present invention may be implemented, for example, by a layout apparatus shown in FIG. 1. The layout apparatus shown in FIG. 1 includes a processing unit 10, memory 20, a cell library 50, an input unit 30, and an output unit 40. The processing unit 10 includes a calculator 11, a selection module 12, and a layout module 13. The calculator 11 calculates delay time for signal propagating paths in the semiconductor integrated circuit based on the original layout information of original circuit elements of the semiconductor integrated circuit. The layout information includes information of layout coordinates of cells immediately after cell arrangement is completed, information of layout coordinates of the cells immediately after global roughing (rough arrangement of interconnects) for connecting the arranged cells is completed, information of layout coordinates of the roughly arranged interconnects for connecting the cells, or the like. The delay time for a signal propagating path calculated by the calculator 11 is hereafter referred to as 'calculated delay time'.

The selection module 12 compares the calculated delay time and corresponding allowable delay time. Based on the comparison result, the selection module 12 selects a combination of cell patterns for the signal propagating path from the cell library 50. The 'allowable delay time' is set as a necessary delay time, which should accommodate a delay time for the signal propagating path so that the semiconductor integrated circuit operates normally. In other words, if a signal propagating path providing a calculated delay time is greater than the allowable delay time, the semiconductor integrated circuit will malfunction. Therefore, the selection module 12 selects cell patterns for cells to be included along the signal propagating path so that the calculated delay time is the allowable delay time or less.

The layout module 13 generates layout data of the signal propagating path in the semiconductor integrated circuit using the selected combination of cell patterns.

The memory 20 includes a connection information area 21, a first layout data area 22, a delay time area 23, a characteristic information area 24, a cell area 25, and a second layout data area 26. The connection information area 21 stores electrical connection information of the semiconductor integrated circuit from which the layout data is generated. The first layout data area 22 stores layout information of circuit elements in the semiconductor integrated circuit. The delay time area 23 stores the calculated delay time for the signal propagating path calculated by the calculator 11. The characteristic information area 24 stores the allowable delay time for the signal propagating path. The cell area 25 stores the cell patterns selected by the selection module 12. The second layout data area 26 stores the layout data generated by the layout module 13.

The cell library 50 stores a plurality of cell patterns respectively differing in signal delay time generated for each of a plurality of cells under a plurality of OPC conditions. 'OPC conditions' are conditions for OPC set to satisfy dimensional tolerance conditions. As already described, the dimensional tolerance conditions are conditions for dimensional tolerances or an allowable range set for differences in dimension between the planar shape of a mask pattern generated through OPC and the planar shape of an element pattern calculated using such mask pattern. In other words, the OPC conditions are conditions for OPC that satisfy the conditions for the differences in dimension between the planar shape of the mask pattern generated through OPC and the planar shape of the element pattern calculated using such mask pattern.

The planar shape of the element pattern to be formed on the wafer is calculated by lithography simulation or the like. Even with cell patterns generated for an identical cell, the planar shapes of those cell patterns subjected to OPC are different so as to satisfy each of a plurality of dimensional tolerance conditions. Therefore, signal delay times for each of the cell patterns generated to satisfy different dimensional tolerance conditions for the identical cell differ from one another.

The input unit 30 includes a keyboard, a mouse pointer, a light pen, and a flexible disk unit or other equivalent elements. A person responsible for generating layout data uses the input unit 30 to designate input/output data. Moreover, setting an output data format via the input unit 30 is possible, and executing data processing and/or inputting an instruction for stopping that execution is also possible. The output unit 40 includes a display and a printer, which display recipe contents, or a recording unit, which stores information in a computer readable recording medium. A 'computer readable recording medium' refers to a medium such as an external storage unit for a computer, a semiconductor memory, a magnetic disk, or an optical disk, which may store electronic data. More specifically, a 'computer readable recording medium' may be a flexible disk, a compact disk read only memory (CD-ROM), or a magneto-optics (MO) disk.

Figure 2:
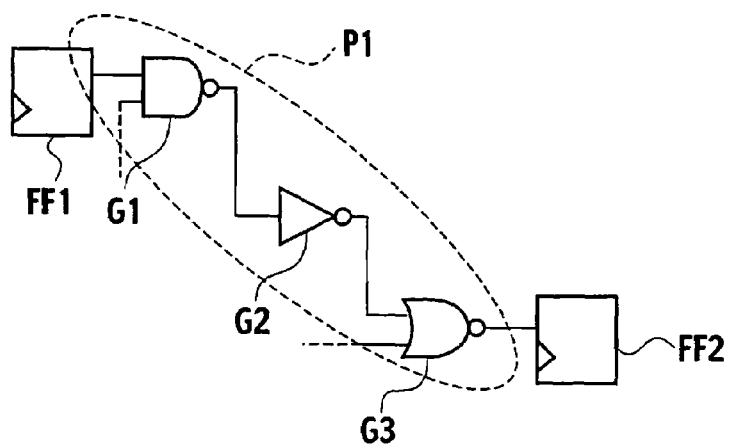
FIG. 2 shows an example of a signal propagating path generated through a method for layout data according to the embodiment of the present invention.

Before describing the method for generating layout data of the semiconductor integrated circuit according the embodiment of the present invention, an exemplary method for selecting a cell pattern corresponding to cells included along a signal propagating path is described using a signal propagating path P1 (hereafter referred to as 'path P1') shown in FIG. 2. The selection module 12 selects such cell pattern from a plurality of cell patterns stored in the cell library 50. The path P1 is a signal propagating path extending from a flip flop FF1 to a flip flop FF2 via a 2-input NAND cell G1, an inverter cell G2, and a 2-input NOR cell G3. A case is described where a group of cell patterns having undergone OPC with a dimensional tolerance of ten percent and a group of cell patterns having undergone OPC with a dimensional tolerance of fifteen percent are stored in the cell library 50. Here, 'cell patterns having undergone OPC with a dimensional tolerance of ten percent' are cell patterns having undergone OPC under OPC conditions set so as to satisfy the dimensional tolerance of ten percent (the same holds true hereafter).

Figure 3:
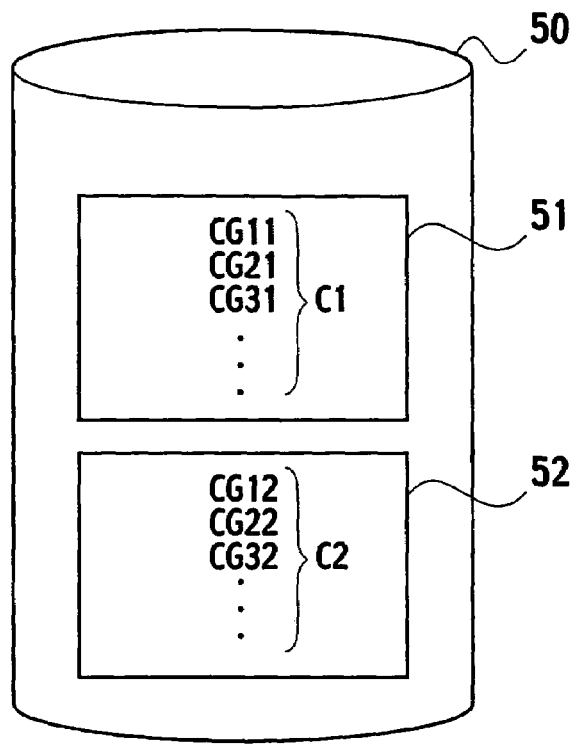
FIG. 3 shows the organization of a cell library of the layout apparatus according to the embodiment of the present invention.

As shown in FIG. 3, a cell pattern CG11, a cell pattern CG21, and a cell pattern CG31 generated by subjecting each of the cell patterns corresponding to the 2-input NAND cell G1, the inverter cell G2, and the 2-input NOR cell G3 to OPC with the dimensional tolerance of ten percent are stored in a first cell pattern area 51 of the cell library 50. A group of the cell patterns having undergone OPC with the dimensional tolerance of ten percent is referred to a cell pattern group C1. In addition, a cell pattern CG12, a cell pattern CG22, and a cell pattern CG32 generated by subjecting a cell pattern corresponding to the 2-input NAND cell G1, the inverter cell G2, and the 2-input NOR cell G3, respectively, to OPC with the dimensional tolerance of fifteen percent are stored in a second cell pattern area 52. A group of the cell patterns having undergone OPC with the dimensional tolerance of fifteen percent is referred to a cell pattern group C2. A case where the cell patterns CG11, CG21, and CG31 included in the cell pattern group C1 may respectively be adopted as the cell patterns corresponding to the 2-input NAND cell G1, the inverter cell G2, and the 2-input NOR cell G3 included along the path P1 stored in the first layout data area 22 is described forthwith.

The selection module 12 calculates a calculated delay time $t_{d1}$ for the path P1 stored in the first layout data area 22. The calculated delay time $t_{d1}$ for the path P1 is a period for a signal transmitted from the flip flop FF1 to reach the flip flop FF2. The selection module 12 also calculates difference between the calculated delay time $t_{d1}$ for the path P1 and an allowable delay time $t_{a1}$. The allowable delay time $t_{a1}$ is read from the characteristic information area 24. The allowable delay time $t_{a1}$ is a cycle time or the like determined from operating frequency of a target semiconductor integrated circuit for which layout data is to be generated.

A signal propagating path, which provides a calculated delay time $t_{d1}$ a little less or greater than the allowable delay time $t_{a1}$, is hereafter referred to as a 'critical path'. As already mentioned, the dimensional tolerance conditions should be relaxed so as to reduce the required time for OPC. However, the more relaxed the dimensional tolerance conditions, the greater the difference between characteristics of the actually manufactured element and the desired element. Therefore, for example, in the case where the cell patterns included in the cell pattern group C1 are respectively selected for all cells included along the path P1 and the calculated delay time $t_{d1}$ for the path P1 is less than the allowable delay time $t_{a1}$, the calculated delay time $t_{d1}$ for the path P1 may become greater than the allowable delay time $t_{a1}$ if a cell pattern included in the cell pattern group C2 is selected for any one of the cells included along the path P1. Therefore, any cell pattern included in the cell pattern group C2 cannot be selected for a cell included along the path P1. Accordingly, when the path P1 is a critical path, the cell patterns CG11, CG21, and CG31 are selected for the 2-input NAND cell G1, the inverter cell G2, and the 2-input NOR cell G3 respectively.

In a case where the calculated delay time $t_{d1}$ is less than the allowable delay time $t_{a1}$ and the difference between the calculated delay time $t_{d1}$ and the allowable delay time $t_{a1}$ is large, the cell patterns included in the cell pattern group C2 may be selected for the 2-input NAND cell G1, the inverter cell G2, and the 2-input NOR cell G3 respectively included along the path P1.

For example, it is assumed that the delay time for the input NAND cell G1 included along the path P1 shown in FIG. 2 is 1.5 when the cell pattern CG11 is selected, and the delay time is 2.1 when the cell pattern CG12 is selected. In such case, when the cell pattern CG11 for a cell pattern corresponding to the 2-input NAND cell G1 is replaced with the cell pattern CG12, the delay time for the 2-input NAND cell G1 increases by 0.6. Here, each delay time is a relative value. Assuming that the delay time for the inverter cell G2 when the cell pattern CG21 is selected increases by 1.0, and the delay time for the inverter cell G2 when the cell pattern CG22 is selected increases by 1.3, the delay time for the inverter cell G2 increases by 0.3 when the cell pattern CG21 for the cell pattern corresponding to the inverter cell G2 is replaced with the cell pattern CG22. In other words, the calculated delay time $t_{d1}$ for the path P1 increases by 0.9.

Here, it is assumed that the allowable delay time $t_{a1}$ for the path P1 is 5.0. When the calculated delay time $t_{d1}$ for the path P1 in the case of using the cell patterns CG11, CG21, and CG31 as the cell patterns corresponding to the 2-input NAND cell G1, the inverter cell G2, and the 2-input NOR cell G3 included along the path P1 is 4.0, and the difference between the allowable delay time $t_{a1}$ and the calculated delay time $t_{d1}$ is 1.0. When the cell pattern CG11 for the cell pattern corresponding to the 2-input NAND cell G1 is replaced with the cell pattern CG12, and the cell pattern CG21 for the cell pattern corresponding to the inverter cell G2 is replaced with the cell pattern CG22, the increase in the calculated delay time $t_{d1}$ for the path P1 is 0.9, and thus the calculated delay time $t_{d1}$ for the path P1 is 4.9. Therefore, even by using the cell patterns included in the cell pattern group C2 with relaxed dimensional tolerance conditions as the cell patterns corresponding to the 2-input NAND cell G1 and the inverter cell G2, the calculated delay time $t_{d1}$ for the path P1 is less than the allowable delay time $t_{a1}$. In other words, even by selecting the cell patterns included in the cell pattern group C2 with relaxed dimensional tolerance conditions as the cell patterns corresponding to the 2-input NAND cell G1 and the inverter cell G2, performance of the semiconductor integrated circuit is not impaired as much as when the cell patterns included in the cell pattern group C1 with strict dimensional tolerance conditions are selected. Thus, the time required for OPC may decrease while maintaining the performance of the semiconductor integrated circuit.

A case in which two types of groups of cell patterns are generated based on different dimensional tolerance conditions, specifically, the cell pattern groups C1 and C2, has been described above. However, alternatively, three or more types of cell pattern groups may be prepared by selecting from the cell pattern groups with the most relaxed dimensional tolerance conditions, cell patterns that correspond to the 2-input NAND cell G1, the inverter cell G2, and the 2-input NOR cell G3, respectively, to be included along the path P1 and that do not decrease the operating speed of the semiconductor integrated circuit. The selected cell patterns corresponding to each of the cells included along the path P1 may be cell patterns formed under more relaxed dimensional tolerance conditions, namely OPC conditions with greater dimensional tolerances, as long as the calculated delay time $t_{d1}$ for the path P1 is less than the allowable delay time $t_{a1}$.

Figure 4:
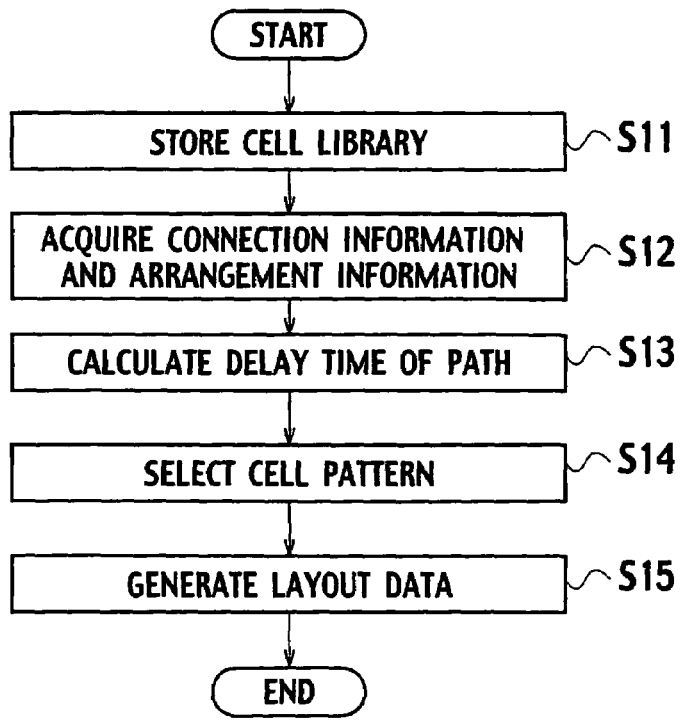
FIG. 4 is a flowchart explaining a method for generating layout data according to the embodiment of the present invention.

A layout data generation method using the layout apparatus shown in FIG. 1 is described forthwith with reference to the flowchart of FIG. 4.

In step S11, cell patterns are stored as cell library information in the cell library 50. In other words, a plurality of cell patterns generated under multiple OPC conditions for each of the cells are stored in the cell library 50 shown in FIG. 1. The plurality of cell patterns may be pre-stored in the cell library 50.

In step S12, connection information for the semiconductor integrated circuit is input to the connection information area 21 via the input unit 30 and is then stored therein. In addition, layout information of circuit elements before roughly arranging interconnects for the semiconductor integrated circuit is input to the first layout data area 22 and is then stored therein. Furthermore, allowable delay time information for signal propagating paths included in the semiconductor integrated circuit is stored in the characteristic information area 24. Note that the connection information, the layout information, and the allowable delay time information may be pre-stored in the connection information area 21, the first layout data area 22, and the characteristic information area 24, respectively.

In step S13, the calculator 11 reads the layout information from the first layout data area 22. Based on the layout information of cells along a certain signal propagating path included in the semiconductor integrated circuit, the calculator 11 selects and allocates cell patterns for each corresponding cell and calculates the delay time for the signal propagating path constituted by the combination of the cell patterns. Delay time for the signal propagating path is calculated for each of the combinations of cell patterns selectable for the cells. The delay time for the signal propagating path constituted by each of the combinations of cell patterns is stored in the delay time area 23.

In step S14, the selection module 12 reads the delay times for the signal propagating path from the delay time area 23 and the allowable delay time for the same from the characteristic information area 24. The selection module 12 selects cell patterns from the cell library 50 using the same method as described by referring to FIG. 2. In other words, the selection module 12 selects combinations of cell patterns, the cell patterns being generated under OPC conditions set such that the more relaxed dimensional tolerance conditions are satisfied within a range that allows the calculated delay times for each of the signal propagating paths included in the semiconductor integrated circuit to be less than the allowable delay time, as combinations of cell patterns required for each of the signal propagating paths. The selected cell patterns are stored in the cell area 25.

In step S15, the layout module 13 reads the cell patterns from the cell area 25 and the connection information from the connection information area 21. The layout module 13 generates layout data of the signal propagating path in the semiconductor integrated circuit based on the information of the combinations of cell patterns and the connection information. The generated layout data is stored in the second layout data area 26.

The layout data stored in the second layout data area 26 can be delivered to the outside of the layout apparatus shown in FIG. 1 via the output unit 40. Furthermore, in the generated layout data, information of the dimensional tolerance conditions for the cell patterns selected for the cells is added to the cells respectively. Mask data of the semiconductor integrated circuit is generated based on the output layout data. Alternatively, circuit simulation may be performed using the layout data.

Generally, most of the signal propagating paths included in the semiconductor integrated circuit are not critical paths. Therefore, the cell patterns of most of the cells may be replaced with the cell patterns generated under the OPC conditions, which are set such that the relaxed dimensional tolerance conditions are satisfied. As a result, the layout data includes layout data of many regions with relaxed dimensional tolerance conditions, which reduces the time required for OPC.

The sequence of layout data generating operations shown in FIG. 4 may be executed by controlling the layout apparatus shown in FIG. 1 in conformity with an algorithm program equivalent to that shown in FIG. 4. This program should be stored in the memory 20 constituting the layout apparatus of FIG. 1. In addition, storing the program in a computer-readable recording medium and then reading it from the storage medium and storing the program in the memory 20 shown in FIG. 1 allows execution of the sequence of layout data generating operations according to the present embodiment.

According to a method for generating layout data of the semiconductor integrated circuit, of the embodiment of the present invention, a plurality of cell patterns generated under different OPC conditions for a single cell are prepared, and cell patterns, generated under OPC conditions that satisfy more relaxed dimensional tolerance conditions within a range where the calculated delay time for the signal propagating path does not exceed the allowable delay time, are selected. Accordingly, the time required for OPC may decrease while maintaining the performance of the semiconductor integrated circuit.

Use of the layout data generated using the above-described method reduces time required for manufacturing the semiconductor integrated circuit, such as mask data generation, mask data verification, and dimension management. Furthermore, manufacturing cost of the semiconductor integrated circuit may be reduced. An exemplary method using information of a plurality of cell patterns generated under different OPC conditions for manufacturing the semiconductor integrated circuit is described forthwith.

The cell patterns generated under different OPC conditions in conformity with dimensional tolerances required by each of the cells are mixed in the layout data, which is generated using the method shown in FIG. 4. In other words, mask data, including data of an area in which a cell group A of cell patterns selected from the cell pattern group C1 is to be, and data of an area in which a cell group B of cell patterns selected from the cell pattern group C2 deployed, is generated.

Different OPC parameters for each of the cells may be set in accordance with the OPC conditions applied to the selected cell patterns so as to generate the above-given mask data. The OPC parameters are set in accordance with the dimensional tolerances required by the cells, defining the OPC conditions. Therefore, the layout data includes information identifying the dimensional tolerances required by each cell. Information identifying the dimensional tolerances required by the cells denotes information of layers and areas allocated to the cells, information such as cell names, and the like. Information of the cells including the information identifying the dimensional tolerances required by the cells is hereafter referred to as 'cell identification information'.

The OPC parameters include an operation repetition number for convergence for performing lithography simulation, optical parameters for performing optical simulation, and correction units for OPC for designed patterns, and the like. The correction units for OPC are referred to as jogs or correction grids. For example, OPC parameters may be set for the aforementioned cell group A with correction accuracy priority, and OPC parameters may be set for the cell group B with processing time priority. As a result, desired correction accuracy may be achieved in a minimum OPC period.

To add the cell identification information to the layout data, the cell groups A and B are allocated to separate layers when roughly arranging interconnects. Alternatively, the names of the cell groups A and B are provided in a table, and based on information in the table after the layout is established, layout changes for the cell groups A and B are made in accordance with differences in required dimensional tolerances. With the layout data (stream data) received during OPC, the required dimensional tolerances may be identified by recognizing the layers to which each of the cells are allocated. The cells may be arranged by selecting cell patterns in accordance with the required dimensional tolerances from a plurality of cell patterns to which a plurality of OPC conditions are applied. Therefore, changing layers in accordance with the dimensional tolerance conditions for the cell patterns to be selected is also possible. With OPC and OPC verification, correction conditions or verification conditions for the layout data may be changed for every layer. Therefore, changing OPC parameters for every layer or the amount of allowable width fluctuation for OPC verification achieves desired correction accuracy and verification accuracy in the shortest processing time.

Figure 5:
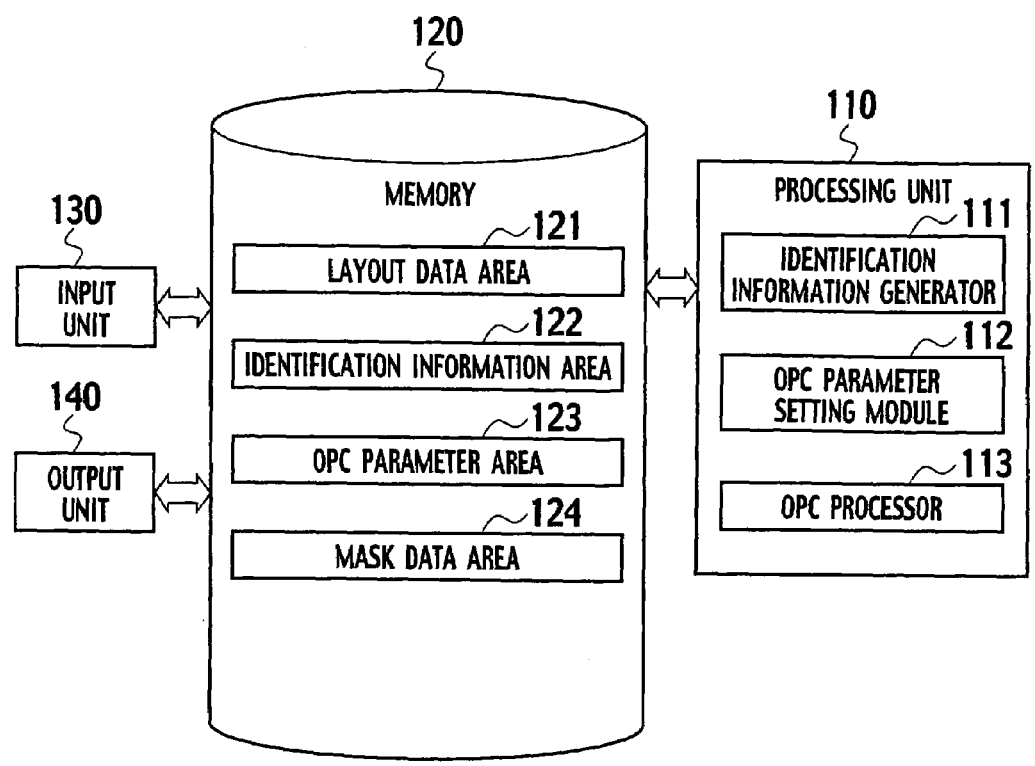
FIG. 5 shows a schematic organization of a mask data generator according to the embodiment of the present invention.

A mask data generator shown in FIG. 5, for example, may implement the mask data generating method described above. The mask data generator shown in FIG. 5 includes a processing unit 110, memory 120, an input unit 130, and an output unit 140.

The processing unit 110 includes an identification information generator 111, an OPC parameter setting module 112, and an OPC processor 113. The identification information generator 111 generates cell identification information in accordance with cell patterns selected for cells. The OPC parameter setting module 112 sets OPC parameters based on the cell identification information. The OPC processor 113 determines OPC conditions based on the OPC parameters, and generates mask data by carrying out OPC on layout data.

The memory 120 includes a layout data area 121, an identification information area 122, an OPC parameter area 123, and a mask data area 124. The layout data area 121 stores layout data of the semiconductor integrated circuit. The identification information area 122 stores cell identification information generated by the identification information generator 111. The OPC parameter area 123 stores OPC parameters set by the OPC parameter setting module 112. The mask data area 124 stores mask data generated by the OPC processor 113 carrying out OPC.

The input unit 130 includes a keyboard, a mouse pointer, a light pen, and a flexible disk unit or other equivalent elements. A person responsible for generating mask data uses the input unit 130 to designate input/output data. The output unit 140 includes a display and a printer, which display recipe contents, or a recording unit, which stores information in a computer readable recording medium.

Figure 6:
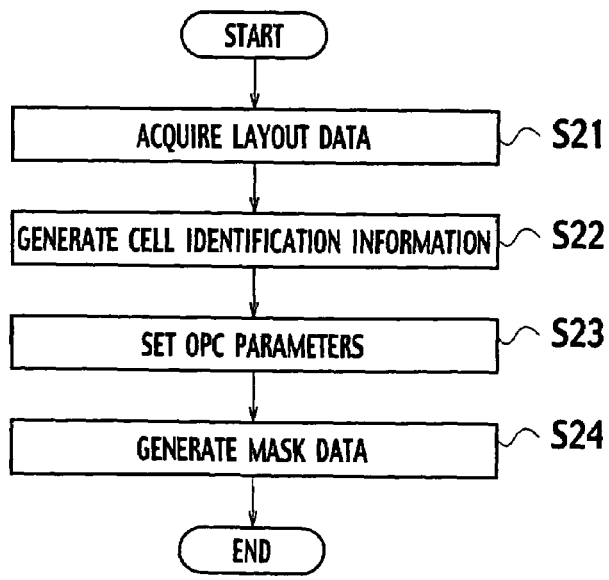
FIG. 6 is a flowchart explaining a method for generating mask data according to the embodiment of the present invention.

An exemplary method for generating mask data from layout data generated using the method described using FIG. 4 by the mask data generator shown in FIG. 5 is described using the flowchart of FIG. 6.

In step S21, layout data for generating mask data is input to the layout data area 121 via the input unit 130. Note that the layout data may be pre-stored in the layout data area 121.

In step S22, the identification information generator 111 reads the layout data from the layout data area 121. The identification information generator 111 generates cell identification information for cell patterns selected for each of the cells in the layout data. For example, as described above, cell groups A and B are each allocated to different layers. The generated cell identification information is stored in the cell information area 122.

In step S23, the OPC parameter setting module 112 reads the cell identification information from the identification information area 122. The OPC parameter setting module 112 sets OPC parameters based on the cell identification information. For example, as described above, the OPC parameters are set in accordance with dimensional tolerances required by the cells so that OPC is carried out with either correction accuracy priority or processing time priority. The set OPC parameters are stored in the OPC parameter area 123.

In step S24, the OPC processor 113 reads the layout data from the layout data area 121 and the OPC parameters from the OPC parameter area 123. The OPC processor 113 subjects the layout data to OPC under defined OPC conditions based on the OPC parameters, thereby generating mask data. The generated mask data is stored in the mask data area 124.

According to the mask data generating method described above, mask data is generated, which includes data of an area in which is to be deployed a cell group A of cell patterns selected from the cell pattern group C1 and data of an area in which is to be deployed a cell group B of cell patterns selected from the cell pattern group C2. The mask data stored in the mask data area 124 can be delivered to the outside of the mask data generator via the output unit 140. Furthermore, information of dimensional tolerance conditions for the cell patterns selected for each of the cells is included in the generated mask data.

Due to recent remarkable reductions in process margin, verification using lithography simulation is required for verifying mask data after OPC. More specifically, lithography of the mask pattern after OPC is simulated so as to calculate the planar shape of an element pattern formed on a wafer using a mask fabricated from the mask data after OPC. Accuracy of the mask data is then verified according to whether or not the difference in planar shape of the calculated element pattern and planar shape of the desired element pattern on the wafer falls within the desired range.

By lithography simulation verification, the OPC conditions to be applied to the cell group A of cell patterns selected from the cell pattern group C1 and the cell group B of cell patterns selected from the cell pattern group C2 are set as simulation parameters. In other words, application of different OPC conditions to the cell patterns included in the cell group A and the cell group B restrains an increase in the amount of layout data. As a result, execution time may decrease while maintaining lithography simulation accuracy. Furthermore, it is possible to keep false-negative errors from occurring during lithography simulation to a minimum. Therefore, verification time may be reduced. Furthermore, mask data verification time may be reduced also by carrying out mask data verification only for the cell group A of cell patterns selected from the cell pattern group C1.

Figure 7:
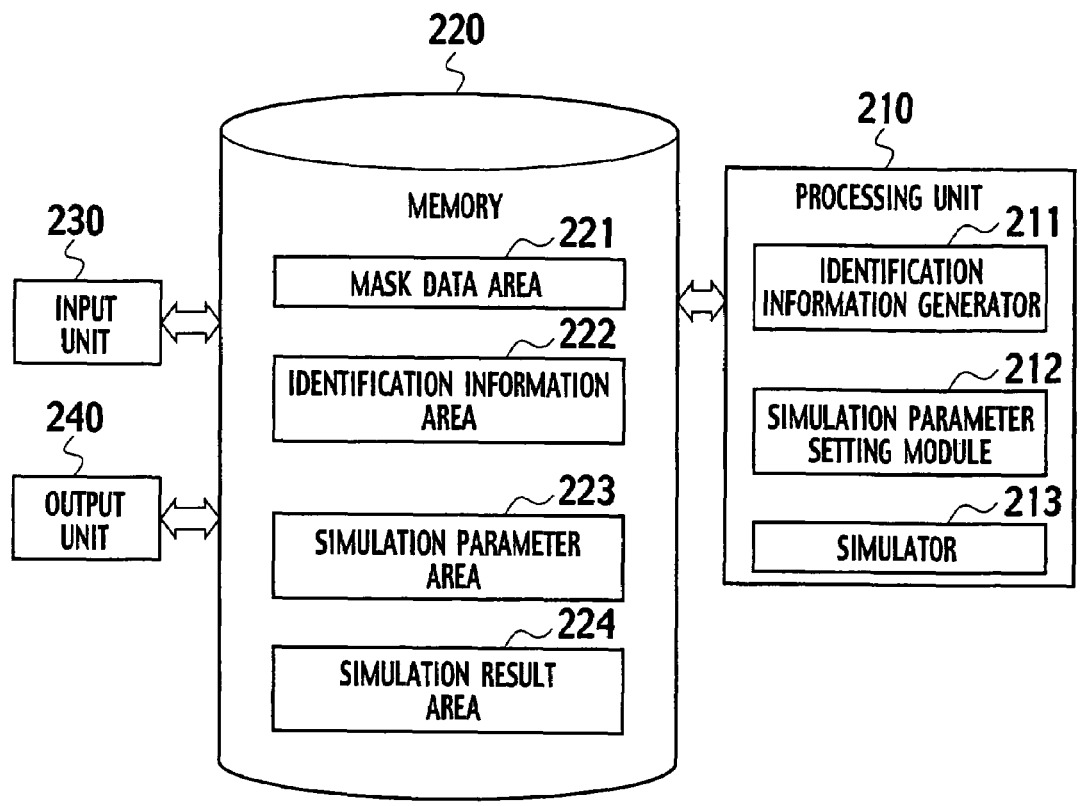
FIG. 7 shows a schematic organization of a mask data verification apparatus according to the embodiment of the present invention.

A mask data verification apparatus shown in FIG. 7, for example, may implement the mask data verifying method described above. The mask data verification apparatus shown in FIG. 7 includes a processing unit 210, memory 220, an input unit 230, and an output unit 240.

The processing unit 210 includes an identification information generator 211, a simulation parameter setting module 212, and a simulator 213. The identification information generator 211 generates cell identification information in accordance with cell patterns selected for the cells. The simulation parameter setting module 212 sets simulation parameters based on the cell identification information. The simulator 213 performs lithography simulation of mask data based on the simulation parameters.

The memory 220 includes a mask data area 221, an identification information area 222, a simulation parameter area 223, and a simulation result area 224. The mask data area 221 stores mask data to be verified. The identification information area 222 stores cell identification information generated by the identification information generator 211. The simulation parameter area 223 stores simulation parameters set by the simulation parameter setting module 212. The simulation result area 224 stores results from lithography simulation run by the simulator 213.

The input unit 230 includes a keyboard, a mouse pointer, a light pen, and a flexible disk unit or other equivalent elements. A person responsible for verifying mask data uses the input unit 230 to designate input/output data. The output unit 240 includes a display and a printer, which display recipe contents, or a recording unit, which stores information in a computer readable recording medium.

Figure 8:
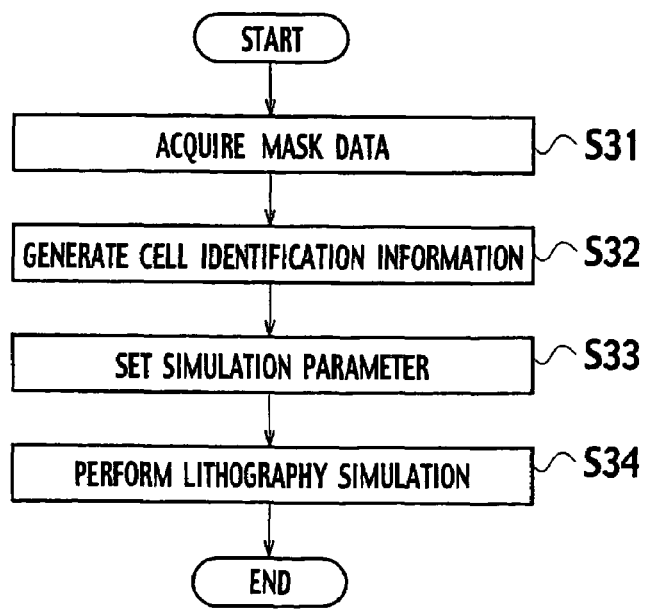
FIG. 8 is a flowchart explaining a method for verifying mask data according to the embodiment of the present invention.

An exemplary method for verifying mask data generated by using the mask data generating method described in FIG. 6, with lithography simulation by the mask data verification apparatus shown in FIG. 7, is described in the flowchart of FIG. 8.

In step S31, mask data of the semiconductor integrated circuit to be verified is input to the mask data area 221 via the input unit 230. Note that the mask data may be pre-stored in the mask data area 221.

In step S32, the identification information generator 211 reads the mask data from the mask data area 221. The identification information generator 211 generates cell identification information for cell patterns selected for each of the cells included in the mask data. The cell identification information is stored in the identification information area 222.

In step S33, the simulation parameter setting module 212 reads the cell identification information from the identification information area 222. The simulation parameter setting module 212 sets simulation parameters to be applied to lithography simulation based on the cell identification information. For example, lithography simulation parameters are set in accordance with dimensional tolerances required by the aforementioned cell groups A and B. The simulation parameters set are stored in the simulation parameter area 223.

In step S34, the simulator 213 reads the mask data from the mask data area 221 and the simulation parameters from the simulation parameter area 223. The simulator 213 performs lithography simulation of mask data based on the simulation parameters. Results of the lithography simulation are stored in the simulation result area 224. The results of the lithography simulation stored in the simulation result area 224 can be delivered to the outside of the mask data verification apparatus via the output unit 240.

Verification of mask data through the above-described lithography simulation reduces the time required for highly accurate mask data verification.

A model for lithography simulation to be used for OPC is determined by fitting the lithography simulation results to test data. Here, 'test data' denotes data of the shape of the pattern actually formed on the wafer using the mask data subjected to OPC. Even when deciding a cell pattern to be used for fitting, the difference in dimensional tolerance conditions may be effectively utilized. More specifically, the amount of test data of cell patterns requiring strict dimensional tolerances is increased, and fitting parameters are weighted in order to improve fitting accuracy for the cells requiring stricter dimensional tolerances than fitting accuracy for the cells requiring relaxed dimensional tolerances. As a result, a simulation model, for cells requiring relaxed dimensional tolerances to be used for accurately estimating a pattern to be formed on the wafer, may be generated.

Dimension management is routinely carried out at the manufacturing plant for the mask data determined to have a small process margin during the above-described mask data verification. Here, 'process margin' denotes a range of process conditions that can be adjusted at the plant in cases where yield of the semiconductor integrated circuit decreases or the like. In other words, when it is determined that maintaining manufacturing yield is impossible with adjustment of process conditions at the plant, dimension management is carried out thereat. Differences in OPC conditions applied to the cell patterns, which are set during layout data generation, may be utilized as a specification for dimension management in such case. In other words, management criteria to be applied to the cell patterns are set in accordance with the dimensional tolerances required by the cells. For example, strict dimension management criteria are applied to the cell group A requiring strict dimensional tolerances, and relaxed dimension management criteria are applied to the cell group B requiring relaxed dimensional tolerances. Application of relaxed dimension management criteria to the cell group B reduces the possibility of regenerating a mask, a reticle or the like. Furthermore, since dimensional tolerances between the manufactured planar shape of the cell group B and the desired planar shape is large even when relaxed dimension management criteria are applied to the cell group B, performance of the semiconductor integrated circuit is not impaired. Since strict dimension management criteria are applied to the cell group A requiring strict dimensional tolerances, impairment of the performance of the semiconductor integrated circuit can be controlled. Thus, manufacturing yields of the semiconductor integrated circuit may be improved.

Figure 9:
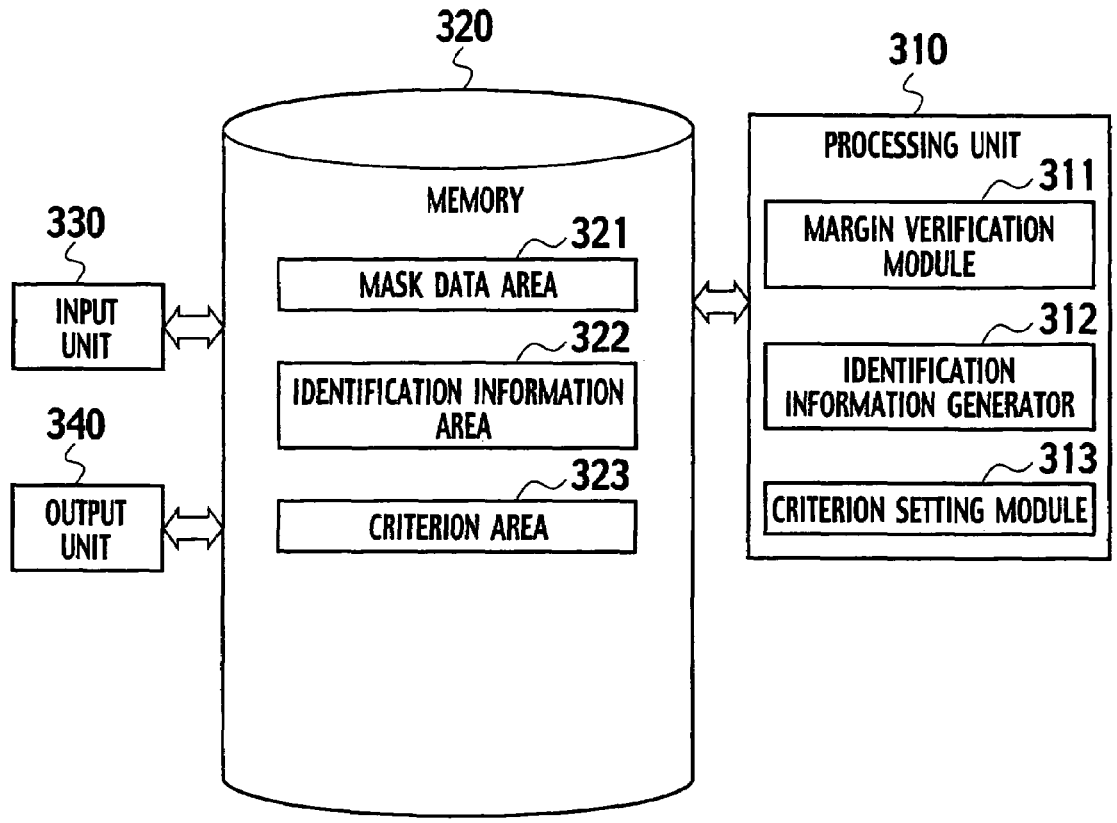
FIG. 9 shows a schematic organization of a dimension management apparatus according to the embodiment of the present invention.

A dimension management apparatus shown in FIG. 9, for example, may implement the dimension management method described above. The dimension management apparatus shown in FIG. 9 includes a processing unit 310, memory 320, an input unit 330, and an output unit 340.

The processing unit 310 includes a margin verification module 311, an identification information generator 312, and a criterion setting module 313. The margin verification module 311 verifies the existence of process margins for mask data. The identification information generator 312 generates cell identification information in accordance with cell patterns selected for cells. The criterion setting module 313 sets dimension management criteria, based on the cell identification information.

The processing unit 320 includes a mask data area 321, an identification information area 322, and a criterion area 323. The mask data area 321 stores mask data, which is a target for dimension management. The identification information area 322 stores cell identification information generated by the identification information generator 312. The criterion area 323 stores management criteria set by the criterion setting module 313.

The input unit 330 includes a keyboard, a mouse pointer, a light pen, and a flexible disk unit or other equivalent elements. A person responsible for setting management criteria uses the input unit 330 to designate input/output data. The output unit 340 includes a display and a printer, which display recipe contents, or a recording unit, which stores information in a computer readable recording medium.

Figure 10:
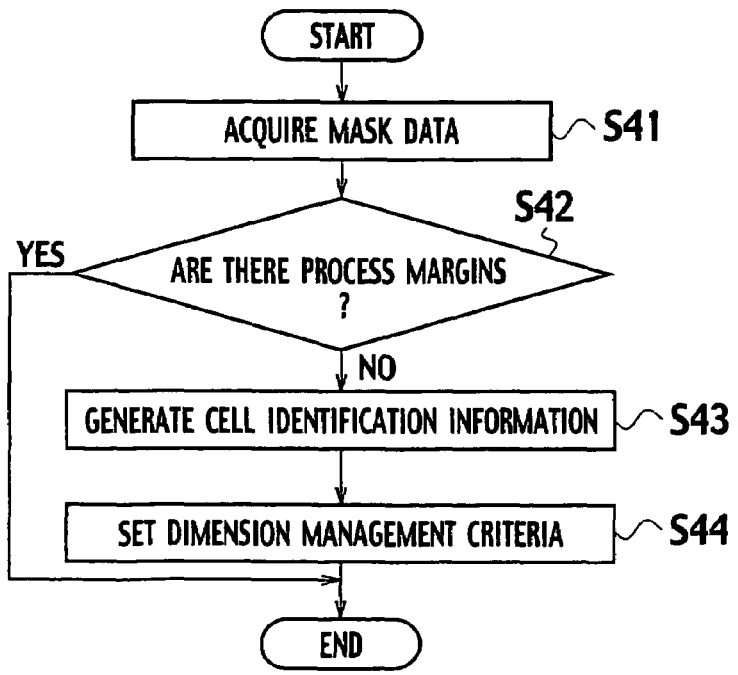
FIG. 10 is a flowchart explaining a method for managing dimensions of mask data according to the embodiment of the present invention.

An exemplary method for managing dimensions of mask data generated using the mask data generating method described in FIG. 6, by the dimension management apparatus shown in FIG. 9, is described by a flowchart of FIG. 10.

In step S41, mask data, which is a target for dimension management, is input to the mask data area 321 via the input unit 330 of FIG. 9. Note that the mask data may be pre-stored in the mask data area 321.

In step S42, the margin verification module 311 reads the mask data from the mask data area 321. The margin verification module 311 verifies the existence of process margins for the mask data. When it is determined that there are process margins, processing is completed. When it is determined that there are no process margins, processing proceeds to step S43.

In the step S43, the identification information generator 312 reads the mask data from the mask data area 321. The identification information generator 312 generates cell identification information of cell patterns selected for each of the cells included in the mask data. The generated cell identification information is stored in the cell information area 322.

In step S44, the criterion setting module 313 reads the cell identification information from the identification information area 322. The criterion setting module 313 sets dimension management criteria for each of the cells, based on the cell identification information. For example, as described above, relaxed dimension management criteria are set when the cells require relaxed dimensional tolerances. The set dimension management criteria are stored in the simulation criterion area 323. The dimension management criteria stored in the criterion area 323 can be delivered to the outside of the dimension management apparatus via the output unit 340.

Furthermore, the above description is not limited to the dimension management routinely carried out at the plant, different dimensional tolerance conditions for the cell patterns may be utilized in stages requiring dimension management, such as a mask manufacturing process or a wafer process. As a result, the number of masks and wafers to be reworked may decrease when using related technologies, thereby reducing the manufacturing cost of the semiconductor integrated circuit.

As described above, preparation of a plurality of cell patterns generated under different OPC conditions reduces the time required for layout data generation, mask data generation, mask data verification, and dimension management. Accordingly, manufacturing a semiconductor integrated circuit by generating a mask using the mask data generated by the above method and implanting impurity ions into a semiconductor substrate using that mask reduces development time for the semiconductor integrated circuit.

Figure 11:
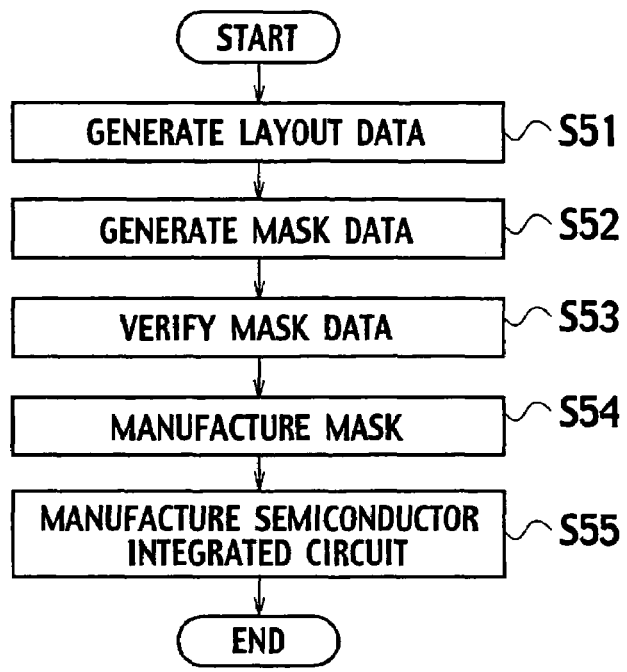
FIG. 11 is a flowchart explaining a method for manufacturing a semiconductor integrated circuit according to the embodiment of the present invention.

In step S51 of FIG. 11, layout data of the semiconductor integrated circuit is generated using the method described in FIG. 4. In other words, a plurality of cell patterns differing in signal delay time are generated for a plurality of different cells under a plurality of OPC conditions. Selection is carried out for cells based on each of the corresponding layout information of the cells to be deployed along a specified signal propagating path in the semiconductor integrated circuit. Delay time for the signal propagating path is then calculated for each of a plurality of combinations of cell patterns. Afterwards, a combination of cell patterns to be used for the signal propagating path is selected from the plurality of combinations based on comparison of lengths of the calculated delay times and the allowable delay time for the signal propagating path. Afterwards, layout data of the semiconductor integrated circuit is generated using the selected combination of cell patterns.

In step S52, mask data is generated using the method described in FIG. 6, based on the layout data generated in the step S51. In other words, the mask data is generated by respectively applying optical proximity correction conditions to cell patterns included in the layout data. In the case of mask data having a plurality of mask levels, a plurality of mask data are generated.

In step S53, the mask data generated in the step S52 is verified using the method described in FIG. 8. In other words, the mask data is verified by setting lithography simulation parameters respectively to each of the cell patterns, and performing lithography simulation based on the set lithography simulation parameters.

In step S54, a mask is manufactured using the mask data verified in the step S53. In the case of mask data having a plurality of mask levels, a plurality of corresponding masks are manufactured utilizing a plurality of mask data.

In step S55, impurity ions, such as boron (B) or phosphorous (P), are implanted in a semiconductor substratum using, for example, a selective ion implanting mask, of the masks manufactured in the step S54, through lithography. For example, if the mask is a selective etching mask, a processing mask such as a photoresist film is formed on the surface of the semiconductor substratum using the selective etching mask, and the surface of the semiconductor substratum is then etched using the processing mask. In the case where there are a plurality of masks, each corresponding to a plurality of mask levels, the semiconductor integrated circuit is manufactured by forming a processing mask that corresponds to the plurality of masks on the surface of the semiconductor substratum, and carrying out in order processing of the semiconductor substratum using the processing mask.

The 'semiconductor substratum' refers to a structure including the semiconductor substrate itself and a thin film formed on the surface of the semiconductor substrate. According to progression of the process, a plurality of thin films are formed on the semiconductor substratum.

As needed, the mask data verified in the step S53 is subjected to dimension management using the method described with respected to FIG. 10. In other words, dimension management is carried out for the mask data, which is determined to have a small process margin through the mask data verification, by setting dimension management criteria to each of the cell patterns. As a result, the yield of the semiconductor integrated circuit may be improved.

According to the semiconductor integrated circuit manufacturing method shown in FIG. 11, the time required for development and manufacturing of the semiconductor integrated circuit is reduced based on the different dimensional tolerance conditions set at the layout stage. Furthermore, development and manufacturing costs of the semiconductor integrated circuit are reduced.

Moreover, making the functions of generating layout data, generating mask data, verifying mask data, and managing dimensions at the plant into a program and systemizing the sequence of operations shown in FIG. 11 allows automatic execution of generating mask data from the design pattern, mask data verification, and dimension management at the plant.

MODIFIED EXAMPLE

An example where cell patterns corresponding to cells included along a signal propagating path that is not a critical path are replaced by cell patterns generated based on relaxed dimensional tolerance conditions has been described above. However, the delay time, calculated based on the layout information of the circuit elements stored in the first layout data area 22 of FIG. 1 before the cell patterns are replaced, may fail to satisfy the allowable delay time. For example, when the cell patterns included in the cell pattern group C1 are selected, it is assumed that there be a cell with a delay time being highly sensitive to non-uniform processing among the 2-input NAND cell G1, the inverter cell G2, and the 2-input NOR cell G3 included along the path P1 shown in FIG. 2. As a result, the calculated delay time $t_{d1}$ for the path P1 is also highly sensitive to non-uniform processing. In other words, the calculated delay time $t_{d1}$ for the path P1 may exceed an allowable delay time $t_{a1}$ due to variations in process conditions.

When there is a cell with a delay time that is highly sensitive to non-uniform processing, selecting cell patterns from the cell library 50 that have only minor affects due to non-uniform process is effective for providing a shorter calculated delay time $t_{d1}$ for the path P1 than the allowable delay time $t_{a1}$. This is possible because making the dimensional tolerance conditions stricter reduces fluctuation of cell delay time.

Figure 12:
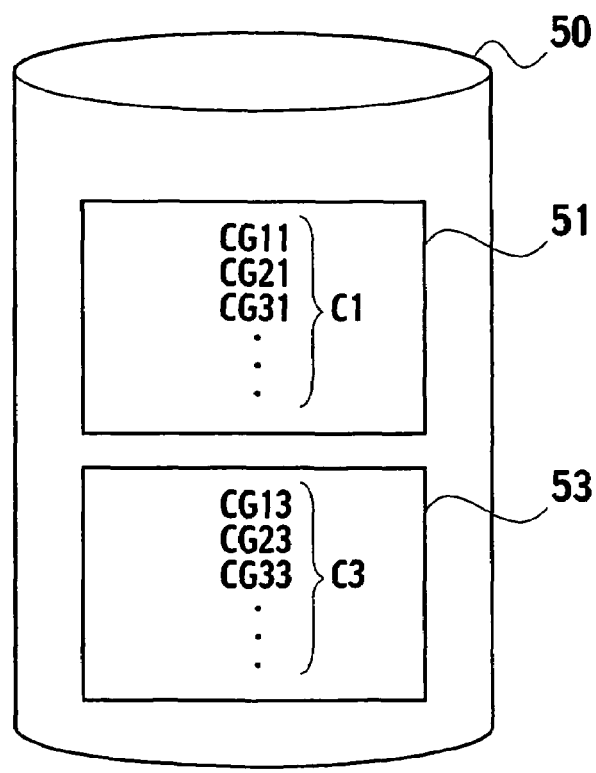
FIG. 12 shows the organization of a cell library of the layout apparatus according to a modified example the embodiment of the present invention.

For example, as shown in FIG. 12, the cell pattern group C3, which is a group of cell patterns having undergone OPC with a dimensional tolerance of five percent, is stored in a third cell pattern area 53 of the cell library 50. The cell pattern group C3 includes a cell pattern CG13, a cell pattern CG23, and a cell pattern CG33 generated by subjecting each of the cell patterns corresponding to the 2-input NAND cell G1, the inverter cell G2, and the 2-input NOR cell G3 included along the path P1 of FIG. 2 to OPC with the dimensional tolerance of five percent. Here, in the case of selecting a cell pattern CG21, it is assumed that the delay time of the inverter cell G2 manufactured under standard process conditions is 1.0 and that the delay time of the inverter cell G2 manufactured under worst process conditions is 1.8. In the case of selecting the cell pattern CG23, it is assumed that the delay time of the inverter cell G2 manufactured under standard process conditions is 1.2 and that the delay time of the inverter cell G2 manufactured under worst process conditions is 1.6. In other words, the case where the cell pattern CG23 is selected as the cell pattern corresponding to the inverter cell G2 may reduce affects from a non-uniform process of the calculated delay time $t_{d1}$ for the path P1 included in the inverter cell G2 more than the case where the cell pattern CG21 is selected.

Figure 13:
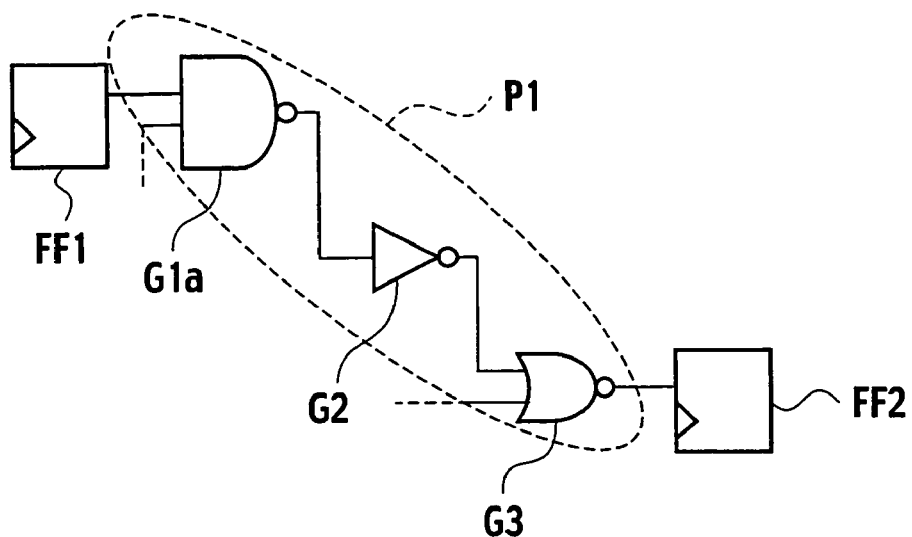
FIG. 13 shows an example of a signal propagating path generated through a method for layout data according to the related art.
Figure 14:
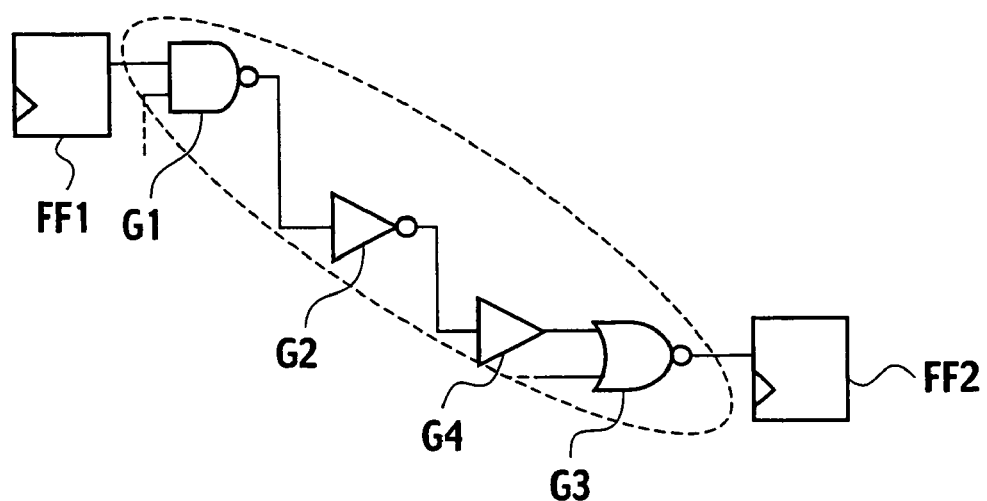
FIG. 14 shows an example of a signal propagating path generated through a method for layout data according to the related art.

When the calculated delay time $t_{d1}$ for the path P1 is greater than the allowable delay time $t_{a1}$ with related technology, as shown in FIG. 13, for example, the 2-input NAND cell G1 is replaced with a 2-input NAND cell G1A with high driving capability. Alternatively, as shown in FIG. 14, a buffer cell G4 may be inserted along the path P1. As a result, the calculated delay time $t_{d1}$ for the path P1 may be improved to be less than the allowable delay time $t_{a1}$. However, the area of the 2-input NAND cell G1A often become larger than the 2-input NAND cell G1 so as to increase its driving capability. In the case where the buffer cell G4 is inserted, the total area of the cells included along the path P1 increases. For example, the total area of the cells included along the path P1 increases by 1.5 to 2 times that before improvement of the calculated delay time $t_{d1}$.

In the case of making stricter dimensional tolerance conditions using the layout data generating method according to the embodiment of the present invention, inter-pattern intervals within a cell may be increased so as to facilitate OPC. For example, the case where the cell pattern CG23 is selected as the cell pattern corresponding to the inverter cell G2 may increase the area of the cell pattern of the inverter cell G2 approximately 1.2 times compared to the case where the cell pattern CG21 is selected. However, compared to the delay time improving method of related technology such as replacing cells with other cells having high driving capability, or adding a buffer cell, selecting the cell pattern CG23 included in the cell pattern group C3 controls the total area increase of the cells included along the path P1 accompanying the improvement in the calculated delay time $t_{d1}$ for the path P1.

OTHER EMBODIMENTS

The case where the calculated delay time fails to satisfy the allowable delay time when there is a non-uniform process has been described above. Cell patterns may be selected in consideration with dependency of cell delay time on temperature and the like, for example, in addition to process non-uniformity. In addition, generation of layout data by selecting cell patterns providing little delay time in the case where desired operating speed of the semiconductor integrated circuit under standard process conditions fails to achieve improvement in operating speed of the semiconductor integrated circuit. Furthermore, although an example of calculating the calculated delay time for the signal propagating path, based on layout information of the semiconductor integrated circuit before roughly arranging interconnects has been given, the calculated delay time for the signal propagating path may be calculated based on layout information after roughly arranging the interconnects.

Various modifications will become possible for those skilled in the art after receiving the teachings of the present disclosure without departing from the scope thereof.

What is claimed is:

1. A computer implemented method for generating layout data of a semiconductor integrated circuit, comprising:
    applying a plurality of optical proximity correction conditions to a plurality of cells, respectively, so as to generate a plurality of cell patterns differing in signal delay time;
    selecting the cell patterns to correspond to each of the cells, based on layout information of cells along a specified signal propagating path in the semiconductor integrated circuit;
    calculating a plurality of delay times for the signal propagating path for combinations of the cell patterns, respectively;
    selecting a combination of cell patterns to be used along the signal propagating path from among the combinations, based on comparison of lengths of the calculated delay times and an allowable delay time for the signal propagating path; and
    generating layout data of the signal propagating path in the semiconductor integrated circuit using the selected combination of cell patterns.

2. The method of claim 1, further comprising:
    setting the allowable delay time as a delay time which should accommodate a delay time for the signal propagating path so that the semiconductor integrated circuit operates normally.

3. The method of claim 2, wherein the allowable delay time is a cycle time determined from operating frequency of the semiconductor integrated circuit.

4. The method of claim 1, wherein the combination of cell patterns to be used along the signal propagating path is selected so that the calculated delay time for the signal propagating path for the combination can be equal to or less than the allowable delay time.

5. The method of claim 4, wherein a cell pattern formed under optical proximity correction conditions is selected for the cells so that the calculated delay time is a maximum.

6. The method of claim 1, wherein the layout information is one of information of layout coordinates of the cells immediately after arrangement of the cells is completed, information of layout coordinates of the cells immediately after global roughing connecting the arranged cells is completed, and information of layout coordinates of roughly arranged interconnects for connecting the cells.

7. The method of claim 1, wherein the optical proximity correction conditions are conditions for optical proximity correction satisfying a plurality of conditions, respectively, for differences in dimension between a planar shape of a mask pattern generated through optical proximity correction and a planar shape of an element pattern calculated using the mask pattern.

8. The method of claim 7, further comprising:
    calculating the planar shape of the element pattern formed on the wafer by simulation.

9. The method of claim 1, further comprising:
    storing the plurality of cell patterns in a cell library.

10. A method for manufacturing a semiconductor integrated circuit, comprising:
    applying a plurality of optical proximity correction conditions to a plurality of cells, respectively, so as to generate a plurality of cell patterns differing in signal delay time; selecting the cell patterns corresponding to each of the cells, based on layout information of cells along a specified signal propagating path in the semiconductor integrated circuit; calculating a plurality of delay times for the signal propagating path for combinations of the cell patterns, respectively; selecting a combination of cell patterns to be used along the signal propagating path from among the combinations, based on comparison of lengths of the calculated delay times and an allowable delay time for the signal propagating path; and generating layout data of the signal propagating path in the semiconductor integrated circuit using the selected combination of cell patterns;
    applying the optical proximity correction conditions to each of the cell patterns so as to generate mask data of a plurality of mask levels, based on the layout data;
    manufacturing a plurality of masks utilizing the mask data of the plurality of mask levels; and
    executing processing of the semiconductor substrate using the masks by forming processing masks in order, each of the processing masks corresponding to one of the masks, respectively, on the surface of a semiconductor substrate.

11. The method of claim 10, wherein the combination of cell patterns to be used along the signal propagating path is selected so that the calculated delay time for the signal propagating path for the combination can be equal to or less than the allowable delay time.

12. The method of claim 10, wherein the optical proximity correction conditions are conditions for optical proximity correction satisfying a plurality of conditions, respectively, for differences in dimension between a planar shape of a mask pattern generated through optical proximity correction and a planar shape of an element pattern calculated using the mask pattern.

13. The method of claim 12, wherein the layout data includes identification information identifying the differences in dimension required by the cells.

14. The method of claim 13, wherein the optical proximity correction conditions to be applied to the plurality of cell patterns are respectively set based on the cell identification information so as to generate the mask data.

15. The method of claim 13, wherein the cell identification information includes layers allocated to the cells, respectively.

16. The method of claim 10, further comprising:
    setting a plurality of simulation parameters to the plurality of cell patterns respectively, based on the mask data; and
    performing simulation based on the plurality of simulation parameters so as to verify the mask data.

17. The method of claim 16, wherein the plurality of simulation parameters are optical proximity correction conditions applied to the plurality of cell patterns respectively.

18. The method of claim 10, further comprising:
setting dimension management criteria for the cell patterns, respectively, so as to carry out dimension management of the mask data.

19. The method of claim 18, wherein the dimension management criteria are set in accordance with the optical proximity correction conditions applied to the plurality of cell patterns, respectively.

20. A computer program product to be executed by a computer for generating layout data of a semiconductor integrated circuit, comprising:
instructions configured to apply a plurality of optical proximity correction conditions to a plurality of cells, respectively, so as to generate a plurality of cell patterns differing in signal delay time;
instructions configured to select the cell patterns correspond to each of the cells, based on layout information of cells along a specified signal propagating path in the semiconductor integrated circuit;
instructions configured to calculate a plurality of delay times for the signal propagating path for combinations of the cell patterns, respectively;
instructions configured to select a combination of cell patterns to be used along the signal propagating path from among the combinations, based on comparison of lengths of the calculated delay times and an allowable delay time for the signal propagating path; and
instructions configured to generate layout data of the signal propagating path in the semiconductor integrated circuit using the selected combination of cell patterns.

* * * * *